United States Patent [19]
Nishi et al.

[11] Patent Number: 5,695,906
[45] Date of Patent: Dec. 9, 1997

[54] PHOTOSENSITIVE RESIN COMPOSITION AND METHOD FOR FORMING A PATTERN USING THE COMPOSITION

[75] Inventors: Mineo Nishi; Koji Nakano; Keisuke Nakano, all of Kitakyushu; Iwao Matsuo, Osaka, all of Japan

[73] Assignee: Mitsubishi Chemical Corporation, Tokyo, Japan

[21] Appl. No.: 328,775

[22] Filed: Oct. 28, 1994

[30] Foreign Application Priority Data

Oct. 28, 1993 [JP] Japan .................. 5-270571

[51] Int. Cl.⁶ .............................. G03F 7/023
[52] U.S. Cl. .................. 430/190; 430/192; 430/193; 430/326
[58] Field of Search ................ 430/190, 192, 430/165, 193, 326

[56] References Cited

U.S. PATENT DOCUMENTS

| | | | |
|---|---|---|---|
| 4,555,469 | 11/1985 | Erdmann et al. | 430/190 |
| 4,719,167 | 1/1988 | Miura et al. | 430/192 |
| 4,859,563 | 8/1989 | Miura et al. | 430/192 |
| 5,279,918 | 1/1994 | Nishi et al. | 430/190 |
| 5,372,909 | 12/1994 | Nishi et al. | 430/192 |

FOREIGN PATENT DOCUMENTS

| | | |
|---|---|---|
| 0 365 318 | 4/1990 | European Pat. Off. |
| 62-28457 | 6/1987 | Japan . |
| 62-150245 | 7/1987 | Japan . |
| 5-34916 | 2/1993 | Japan . |
| 5-34917 | 2/1993 | Japan . |
| 5-119475 | 5/1993 | Japan . |
| WO 90/01726 | 2/1990 | WIPO . |

*Primary Examiner*—John S. Chu
*Attorney, Agent, or Firm*—Oblon, Spivak, McClelland, Maier & Neustadt, P.C.

[57] ABSTRACT

A photosensitive resin composition comprising an alkali-soluble resin, a quinonediazide-type photosensitive compound and a solvent, wherein the photosensitive compound comprises ① a quinonediazide sulfonate of a novolak resin (A) of the following formula (i) having a weight average molecular weight of from 600 to 2,200 or a novolak resin (B) of the following formula (ii) having a weight average molecular weight of from 600 to 2,200, and ② a quinonediazide sulfonate of a hydroxybenzophenone (C) of the following formula (iii):

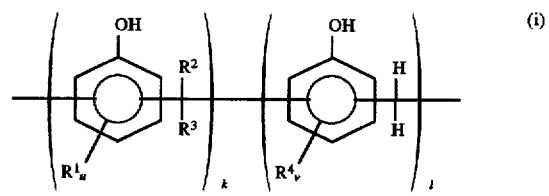

wherein each of $R^1$ and $R^4$ is an alkyl group, $R^2$ is an alkyl group or an aryl group, $R^3$ is a hydrogen atom or an alkyl group, each of u and v is an integer of from 0 to 3, provided that when each of $R^1$ to $R^4$ is present in a plurality, the plurality of each of $R^1$ to $R^4$ may be the same or different, and each of k and l is a number of at least 0, provided that k:l=1:9 to 10:0;

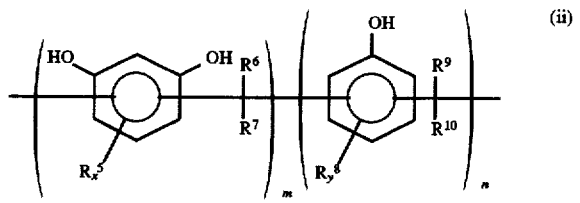

wherein $R^5$ is a hydroxyl group or a alkyl group, each of $R^6$ and $R^9$ is a hydrogen atom, an alkyl group or an aryl group, each of $R^7$ and $R^{10}$ is a hydrogen atom or an alkyl group, $R^8$ is an alkyl group, x is an integer of from 0 to 2, y is an integer of from 0 to 3, provided that when each of $R^5$ to $R^{10}$ is present in a plurality, the plurality of each of $R^5$ to $R^{10}$ may be the same or different, and each of m and n is a number of at least 0, provided that m:n=10:0 to 6:4;

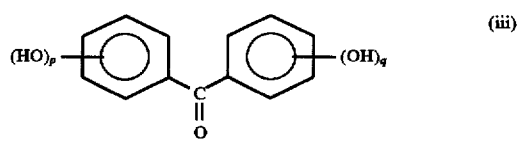

wherein each of p and q is an integer of at least 0, provided that $3 \leq p+q \leq 6$.

17 Claims, No Drawings

PHOTOSENSITIVE RESIN COMPOSITION AND METHOD FOR FORMING A PATTERN USING THE COMPOSITION

BACKGROUND OF THE INVENTION

1. Field of the Invention

The present invention relates to a photosensitive resin composition comprising an alkali-soluble resin, a quinonediazide-type photosensitive compound and a solvent, as the main components. More particularly, it relates to a photoresist for forming a highly integrated circuit, which has high resolution and high sensitivity and is excellent in heat resistance and patterning ability. Further, the present invention relates to a method for forming a pattern using such a photosensitive resin composition.

2. Discussion of Background

A positive photoresist is known which comprises an alkali-soluble novolak resin and a quinonediazide-type photosensitive compound which is capable of functioning as an alkali dissolution inhibitor. With such a photoresist, at an exposed portion, the quinonediazide-type photosensitive compound decomposes to carben and then to a ketene, which reacts with a water within or outside the system to form indenecarboxylic acid, which is readily soluble in an aqueous alkaline solution. On the other hand, at a non-exposed portion, the quinonediazide-type photosensitive compound hinders the solubility of the alkali-soluble novolak resin in the alkaline developer (hereinafter such a hindering effect is referred to as a masking effect), whereby the non-exposed portion is hardly soluble in an alkaline developer, maintains a high film-remaining ratio, undergoes no substantial swelling and is capable of forming a fine pattern. Thus, it is frequently used for the preparation of integrated circuits.

For example, as such a positive resist, Japanese Examined Patent Publication No. 28457/1987 discloses a positive photoresist composition containing a photosensitive component which contains a naphthoquinonediazide-5- or 4-sulfonic acid tetraester of 2,3,4,4'-tetrahydroxybenzophenone. Japanese Unexamined Patent Publication No. 150245/1987 discloses a positive radiation sensitive resin composition containing a 1,2-quinonediazide compound such as a 1,2-naphthoquinonediazide-5-sulfonic acid triester of 2,3,4,2',6'-pentahydroxybenzophenone in addition to an alkali-soluble resin. Japanese Unexamined Patent Publication No. 34917/1993 discloses a positive resist composition comprising a novolak resin, a quinone diazide sulfonate of an at least tetrahydric phenol compound and a quinonediazide sulfonate of an at most trihydric phenol compound. Japanese Unexamined Patent Publication No. 119475/1993 discloses a radiation sensitive composition comprising a partial ester of 2,3,4,4'-tetrahydroxybenzophenone with 1,2-naphthoquinonediazide-5-sulfonic acid, and a complete ester of dihydroxy benzophenone with 1,2-naphthoquinonediazide-5-sulfonic acid and/or a partial or complete ester of trihydroxybenzophenone with 1,2-naphthoquinonediazide-5-sulfonic acid.

Meantime, integrated circuits have been increasingly highly integrated year after year, and the resolving power required for the resist has become finer accordingly. As a method for improving the resolving power, it is common to increase the quantity of photosensitive groups in the resist, but a deterioration in the sensitivity is thereby inevitable. Especially when a naphthoquinonediazide sulfonate of a hydroxybenzophenone which has been widely used as a photosensitive compound, is employed, the heat resistance is good, but a deterioration in the sensitivity tends to be more distinct with high absorption of light by the photosensitive agent in the region of i-line (wavelength: 365 nm) which has been used for semiconductor lithography in recent years. Further, since the difference in the energy of the transmitted lights is substantial as between the top and bottom of the resist film coated on a wafer, the pattern profile tends to be trapezoided, and there has been a limitation in improving the resolving power.

On the other hand, a photoresist has been proposed which contains a photosensitive compound having quinonediazide compound as a photosensitive component bonded to a novolak resin having a low molecular weight separate from an alkali-soluble resin, instead of having it bonded to a hydroxybenzophenone. For example, the specification of WO90/01726 discloses a positive photoresist composition having incorporated to a non-photosensitive novolak resin a photosensitive novolak resin such as 1,2-naphthoquinonediazide-5-sulfonate of a condensation product (average molecular weight: 600) of p-cresol with formaldehyde. The specification of U.S. Pat. No. 5,279,918 discloses a photoresist composition comprising an alkali-soluble resin and e.g. a 1,2-naphthoquinonediazide sulfonate of a condensation product of m-cresol with acetaldehyde. Japanese Unexamined Patent Publication No. 34916/1993 discloses a photoresist composition comprising an alkali-soluble resin and e.g. a 1,2-naphthoquinonediazide-5-sulfonate of a condensation product of pyrogallol with acetone.

However, the demand for an improved resolving power is increasing. To satisfy this demand, if the molecular structure of the novolak resin to be used for the photosensitive compound is controlled, it is possible to improve the above mentioned masking effect and to accomplish a high resolving power, but there is a problem that the sensitivity and the heat resistance will then be inadequate. Especially, with respect to the heat resistance, resistance against a heat of at least 120° C., preferably at least 125° C., is practically desired.

On the other hand, EP 365318 specification discloses a positive resist containing a mixture of resin A having a weight average molecular weight of from 4000 to 20,000 as calculated as standard polystyrene and resin B having a weight average molecular weight of from 200 to 2,000 as calculated as standard polyestyrene as an alkali-soluble novolak resin, a 1,2-quinonediazide sulfonate of resin B and e.g. a quinonediazide sulfonate of 2,3,4,4'-tetrahydroxybenzophenone. However, even when the quinonediazide sulfonate of a novolak resin and the quinonediazide sulfonate of a hydrobenzophenone are used in combination as the photosensitive agent, the sensitivity, the resolving power or the heat resistance is still inadequate depending upon the type of the photosensitive agent.

SUMMARY OF THE INVENTION

It is an object of the present invention to provide a positive photosensitive resin composition which has a high resolving power as well as practical sensitivity and high heat resistance and which is capable of presenting an excellent pattern profile, whereby various properties are well balanced.

It is another object of the present invention to provide a method for forming a pattern using such a photosensitive resin composition.

As a result of extensive studies to solve the above-mentioned problems, the present inventors have found that when a combination of a photosensitive compound having a quinonediazide compound bonded to a novolak resin having a low molecular weight and a certain specific structure separate from an alkali-soluble resin which is a component of a photoresist and a photosensitive compound having a quinonediazide compound bonded to a hydroxybenzophenone, is used as the photosensitive component, the resulting photoresist containing such a photosensitive component, has a high resolving power as well as a practical sensitivity and high heat resistance and it is capable of presenting an excellent pattern profile, as compared with conventional products. The present invention has been accomplished on the basis of this discovery.

Namely, the present invention provides a photosensitive resin composition comprising an alkali-soluble resin, a quinonediazide-type photosensitive compound and a solvent, wherein the photosensitive compound comprises ① a quinonediazide sulfonate of a novolak resin (A) of the following formula (i) having a weight average molecular weight of from 600 to 2,200 or a novolak resin (B) of the following formula (ii) having a weight average molecular weight of from 600 to 2,200, and ② a quinonediazide sulfonate of a hydroxybenzophenone (C) of the following formula (iii):

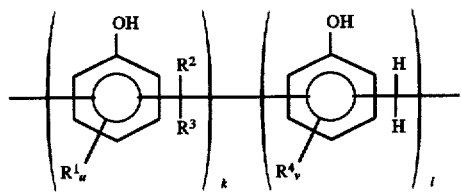
(i)

wherein each of $R^1$ and $R^4$ is an alkyl group, $R^2$ is an alkyl group or an aryl group, $R^3$ is a hydrogen atom or an alkyl group, each of u and v is an integer of from 0 to 3, provided that when each of $R^1$ to $R^4$ is present in a plurality, the plurality of each of $R^1$ to $R^4$ may be the same or different, and each of k and l is a number of at least 0, provided that k:l=1:9 to 10:0;

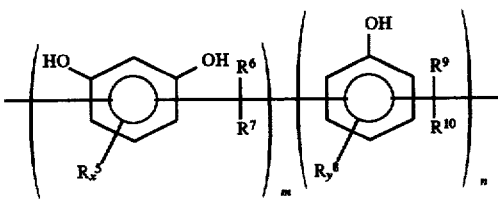
(ii)

wherein $R^5$ is a hydroxyl group or an alkyl group, each of $R^6$ and $R^9$ is a hydrogen atom, an alkyl group or an aryl group, each of $R^7$ and $R^{10}$ is a hydrogen atom or an alkyl group, $R^8$ is an alkyl group, x is an integer of from 0 to 2, y is an integer of from 0 to 3, provided that when each of $R^5$ to $R^{10}$ is present in a plurality, the plurality of each of $R^5$ to $R^{10}$ may be the same or different, and each of m and n is a number of at least 0, provided that m:n=10:0 to 6:4;

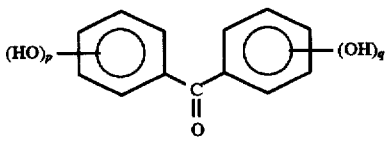
(iii)

wherein each of p and q is an integer of at least 0, provided that $3 \leq p+q \leq 6$.

Further, the present invention provides a method for forming a resist pattern on a substrate for a semiconductor, which comprises coating such a photosensitive resin composition on the substrate subjecting it to exposure to copy a pattern and then developing it to form the pattern.

DETAIL DESCRIPTION OF THE PREFERRED DESCRIPTION

Now, the present invention will be described in detail.

In the photoresist composition of the present invention, the alkali-soluble resin may, for example, be a novolak resin, a resol resin, a polyvinyl phenol resin or a polyacrylate resin. The molecular weight of this alkali-soluble resin is larger than the molecular weight of the novolak resin constituting the after-mentioned photosensitive compound and thus is clearly distinguished from such a novolak resin. Namely, the weight average molecular weight (as analyzed and calculated as polyestyrene by gel permeation chromatography) of the alkali-soluble resin is usually from 3,000 to 20,000.

As such an alkali-soluble resin, a novolak resin is particularly preferred. The novolak resin is not particularly limited. However, preferred is a novolak resin obtained by polycondensation by heating two or more phenols or polyhydroxybenzenes selected from phenols such as phenol, o-cresol, m-cresol, p-cresol, 2,5-xylenol, 3,5-xylenol and 2,3,5-trimethylphenol, or polyhydroxybenzenes such as resorcinol, 2-methylresorcinol, 5-methylresorcinol and pyrogallol, with one or more members selected from carbonyl compounds, for example, aliphatic aldehydes such as formaldehyde, paraformaldehyde, acetaldehyde and propylaldehyde, aromatic aldehydes such as benzaldehyde, and alkyl ketones such as acetone, in the presence of an acidic catalyst such as hydrochloric acid, sulfuric acid or oxalic acid.

More preferred is a novolak resin obtained by polycondensing a two component mixture comprising m-cresol and p-cresol, or a three or four component mixture comprising such two components plus 2,5-xylenol and/or 3,5-xylenol, with formaldehyde and/or acetaldehyde, or a novolak resin obtained by polycondensing a mixture of m-cresol, p-cresol, 2,5-xylenol and resorcinol, with formaldehyde and/or acetaldehyde. The mixing ratio (molar ratio) of m-cresol, p-cresol, 2,5- or 3,5-xylenol, and resorcinol is usually 1-7:3-7:0-5:0-1.

When formaldehyde and acetaldehyde are used in combination as carbonyl compounds, their blending ratio is preferably such that formaldehyde:acetaldehyde=95-40:5-60 (molar ratio), more preferably 90-50:10-50 (molar ratio).

Particularly preferred is a novolak resin which is a condensation product of a mixture of m-cresol, p-cresol and 2,5-xylenol with the mixing ratio of m-cresol:p-cresol:2,5-xylenol=3-6:3-5:0-3 (molar ratio), with formaldehyde alone or with a mixture of formaldehyde and acetaldehyde with the mixing ratio of formaldehyde:acetaldehyde=90-50:10-50 (molar ratio).

In the present invention, it is essential to use, as the quinonediazide photosensitive compound, both the quinonediazide sulfonate of a novolak resin having a certain specific structure and a weight average molecular weight of from 600 to 2,200 (hereinafter sometimes referred to as "a low molecular weight novolak resin") and the quinonediazide sulfonate of a hydroxybenzophenone.

The low molecular weight novolak resin constituting the photosensitive compound, is represented by the above formula (i) or (ii) and is a polycondensation product of a phenolic compound and a carbonyl compound constituting such a novolak resin.

The novolak resin (A) is represented by the above mentioned formula (i). Here, the alkyl group for each of $R^1$, $R^2$, $R^3$ and $R^4$ may be a linear or branched $C_{1-4}$ alkyl group such as a methyl group, an ethyl group, a n-propyl group or an i-propyl group. The aryl group for $R^2$ may, for example, be a phenyl group, and each of u and v is an integer of from 0 to 3. In the formula (i), when each of $R^1$ to $R^4$ is present in a plurality, the plurality of each of $R^1$ to $R^4$ may be the same of different, but it is preferred that the plurality of each of $R^1$ to $R^4$ are the same.

Preferred is that in the formula (i), $R^1$ and $R^4$ are the same, each being a $C_{1-2}$ alkyl group, more preferably a methyl group. $R^2$ is particularly preferably a methyl group, $R^3$ is particularly preferably a hydrogen atom or a methyl group, and each of u and v is preferably 1.

The novolak resin (A) is obtained usually by polycondensing an alkyl-substituted monohydric phenol with a carbonyl compound. Such an alkyl-substituted monohydric phenol may, for example, be m-cresol, p-cresol, 3-ethylphenol or 4-ethylphenol, preferably a cresol, more preferably m-cresol. The carbonyl compound may, for example, be an aliphatic aldehyde such as formaldehyde, paraformaldehyde, acetaldehyde or propionaldehyde, an aromatic aldehyde such as benzaldehyde, an aliphatic ketone such as acetone, methyl ethyl ketone or diethyl ketone, or an aromatic ketone such as acetyl benzene or benzophenone. Among them, an aliphatic aldehyde and an aliphatic ketone are preferred. Particularly preferred is formaldehyde, acetaldehyde or acetone.

As is evident from its structure, the novolak resin (A) contains, as an essential component, an aldehyde or a ketone other than formaldehyde, as a carbonyl compound.

In the above formula (i), each of k and l is a number of at least 0, and the ratio of repeating units k:l is within a range of from 1:9 to 10:0. This ratio is not particularly limited so long as it is within the above range. However, there is a tendency such that the larger the ratio of k to l, the better the heat resistance of the resist. On the other hand, there is a tendency such that the larger the ratio of l to k, the better the pattern profile. Therefore, depending upon the desired performance of the resist, the types and the blending ratio of the phenolic compound and the carbonyl compound as the starting materials, may be selected, and the ratio of repeating units k:l in the novolak resin (A) may suitably be adjusted.

Especially from the viewpoint of the resolving power and heat resistance, it is preferred that l=0. Further, there is a tendency that the pattern profile will be excellent when the quinonediazide sulfonate of the novolak resin (A) is used in combination with the quinonediazide sulfonate of the hydroxybenzophenone (C).

On the other hand, the novolak resin (B) is represented by the above formula (ii). Here, the alkyl group for each of $R^5$, $R^6$, $R^7$, $R^8$, $R^9$ and $R^{10}$ may be a linear or branched $C_{1-4}$ alkyl group such as a methyl group, an ethyl group, a n-propyl group or an i-propyl group. The aryl group for each of $R^6$ and $R^9$ may, for example, be a phenyl group.

When each of $R^5$ to $R^{10}$ is present in a plurality, the plurality of each of $R^5$ to $R^{10}$ may be the same or different, but it is preferred that the plurality of each of $R^5$ to $R^{10}$ are the same. Further, $R^6$ and $R^9$, or $R^7$ and $R^{10}$, may be the same or different, respectively, but they are preferably the same, respectively.

In the above formula (ii), each of $R^6$ and $R^9$ is preferably an alkyl group or an aryl group, and each of $R^7$ and $R^{10}$ is preferably a hydrogen atom or an alkyl group. Especially, $R^5$ is preferably a hydroxyl group or a methyl group, $R^8$ is preferably a methyl group, each of $R^6$ and $R^9$ is preferably a methyl group or a phenyl group, and each of $R^7$ and $R^{10}$ is preferably a hydrogen atom or a methyl group. More preferably, $R^5$ is a hydroxyl group, $R^8$ is a methyl group, each of $R^6$ and $R^9$ is a methyl group, and each of $R^7$ and $R^{10}$ is a hydrogen atom or a methyl group.

x is an integer of from 0 to 2, and y is an integer of from 0 to 3. However, x is preferably 0 or 1, and y is preferably 1.

The novolak resin (B) can be obtained usually by polycondensing a polyhydroxybenzene which may be substituted by an alkyl group, or such a polyhydroxybenzene and an alkyl-substituted monohydric phenol, with a carbonyl compound. Such a polyhydroxybenzene may, for example, be a resorcinol such as resorcinol, 2-methylresorcinol, 4-methylresorcinol, 5-methylresorcinol or 2-ethylresorcinol, a catechol such as catechol, 3-methylcatechol or 4-methylcatechol, or pyrogallol. Among them, resorcinol, 2-methylresorcinol or pyrogallol is preferred. Particularly preferred is pyrogallol. The monohydric phenol may, for example, be m-cresol, p-cresol, 3-ethylphenol or 4-ethylphenol, preferably a cresol, more preferably m-cresol.

The carbonyl compound may, for example, be an aliphatic aldehyde such as formaldehyde, paraformaldehyde, acetaldehyde or propionaldehyde, an aromatic aldehyde such as benzaldehyde, an aliphatic ketone such as acetone, methyl ethyl ketone, diethyl ketone, or an aromatic ketone such as acetyl benzene or benzophenone. Among them, acetaldehyde, benzaldehyde or acetone is preferred. Particularly preferred is acetaldehyde or acetone.

As is evident from its structure, the novolak resin (B) contains a polyhydroxybenzene as an essential component. Further, each of m and n is a number of at least 0, and the ratio of repeating units m:n in the above formula (ii) is within a range of from 10:0 to 6:4. The ratio is not particularly limited so long as it is within the above range. However, there is a tendency such that the larger the ratio of m to n, the better the heat resistance. Therefore, depending upon the desired performance of the resist, the types and the blending ratio of the polyhydroxybenzene, the alkyl-substituted monohydric phenol and the carbonyl compound as the starting materials, may be selected so that the ratio of the repeating units m:n in the novolak resin (B) is suitably adjusted.

Especially from the viewpoint of the sensitivity and the heat resistance, it is preferred that $R^5$ is a hydroxyl group, each of $R^6$ and $R^7$ is a methyl group, and n is 0.

As a method for producing a low molecular weight novolak resin (A) or (B) from the phenol and the carbonyl compound as described above, a method may be employed wherein the above described phenol and the carbonyl compound are poly-condensed in the presence of an acidic catalyst in accordance with a known method. The temperature for the polycondensation reaction is usually from 50° to 200° C.

The weight average molecular weight (as analyzed and calculated as polystyrene by gel permeation chromatography) of each of the novolak resins (A) and (B) is required to be from 600 to 2,200. If the weight average molecular weight of the novolak resin (A) Or (B) is too small, the masking effect tends to be small, whereby a good pattern profile can hardly be obtained, and the heat resistance also tends to be poor. On the other hand, if it is too large, the masking effect tends to be so high that the sensitivity tends to be poor.

The molecular weight of the novolak resin can be adjusted, for example, by controlling the amount of the catalyst when a ketone is used as the starting material or by controlling the amount of the starting material when an aldehyde is used as the starting material.

The quinonediazide sulfonate of the above novolak resin (A) or (B) may, for example, be an esterification product of e.g. 1,2-benzoquinonediazide-4-sulfonic acid, 1,2-naphtoquinonediazide-4-sulfonic acid, 1,2-naphtoquinonediazide-5-sulfonic acid, 2,1-naphtoquinonediazide-4-sulfonic acid, 2,1-naphtoquinonediazide-5-sulfonic acid, 2,1-naphtoquinonediazide-6-sulfonic acid, 2,1-naphtoquinonediazide-7-sulfonic acid, or 2,1-naphtoquinonediazide-8-sulfonic acid. These esterification products may be used alone or in combination as mixture. Among them, esterification products of 1,2-naphtoquinoneidazide-5-sulfonic acid and 1,2-naphtoquinondiazide-4-sulfonic acid are preferred. Particularly preferred is an esterification product of 1,2-naphtoquinonediazide-5-sulfonic acid.

The above quinonediazide sulfonate of the novolak resin (A) or (B) can be produced by reacting the novolak resin (A) or (B) with a sulfonyl chloride corresponding to the above quinonediazide sulfonic acid, such as 1,2-naphtoquinonediazide-5-sulfonic acid chloride, in a solvent capable of dissolving the reactants, in the presence of a basic catalyst such as triethylamine at room temperature in accordance with a conventional method.

The esterification ratio of such a quinonediazide sulfonate of the novolak resin (A) or (B) i.e. the ratio of substitution of the quinonediazide sulfonyl group for hydrogen in the hydroxyl groups contained in the novolak resin (A) or (B) [i.e. (number of quinonediazide sulfonyl groups per molecule of the quinonediazide sulfonate)×100/(number of hydroxyl groups per molecule of the novolak resin)] is preferably from 20 to 80%. If the esterification ratio is too high, the masking effect tends to be so high that the sensitivity tends to deteriorate. On the other hand, if the esterification ratio is too low, the masking effect tends to be inadequate, whereby the pattern profile will be poor.

The other photosensitive compound of the present invention is a quinonediazide sulfonate of a hydroxybenzophenone (C) of the above formula (iii).

The hydroxybenzophenone of the formula (iii) may, for example, be a hexahydroxybenzophenone such as 2,3,4,2', 3',4'-hexahydroxybenzophenone or 2,3,4,3',4',5'-hexahydroxybenzophenone, a pentahydroxybenzophenone such as 2,3,4,2',4'-pentahydroxybenzophenone, 2,3,4,2',3'-pentahydroxybenzophenone or 2,3,4,3',5'-pentahydroxybenzophenone, a tetrahydroxybenzophenone such as 2,3,4,3'-tetrahydroxybenzophenone, 2,3,4,4'-tetrahydroxybenzophenone, 2,4,2',4'-tetrahydroxybenzophenone, 2,3,4,2'-tetrahydroxybenzophenone, 2,3,2',4'-tetrahydroxybenzophenone, 2,5,2',5'-tetrahydroxybenzophenone, 2,5,3',4'-tetrahydroxybenzophenone or 2,5,3',5'-tetrahydroxybenzophenone, or a trihydroxybenzophenone such as 2,3,4-trihydroxybenzophenone. Among them, a compound of the formula (iii) wherein 4≦p+q≦6, is preferred. More preferred is a compound wherein 5≦p+q≦6. Especially, a pentahydroxybenzophenone is preferred, and 2,3,4,2',4'-pentahydroxybenzophenone is most preferred.

The quinonediazide sulfonate of the above hydroxybenzophenone (C) may, for example, be the same esterification product of a quinonediazide sulfonic acid as exemplified with respect to the above described quinonediazide sulfonate of the novolak resin (A) or (B), preferably an esterification product of 1,2-naphtoquinonediazide-5-sulfonic acid or 1,2-naphtoquinonediazide-4-sulfonic acid, more preferably an esterification product of 1,2-naphtoquinonediazide-5-sulfonic acid.

The above quinonediazide sulfonate of the hydroxybenzophenone (C) can be produced by reacting the hydroxybenzophenone (C) with a sulfonyl chloride corresponding to the above mentioned quinonediazide sulfonic acid, such as 1,2-naphtoquinonediazide-5-sulfonic acid chloride, in an organic solvent capable of dissolving such reactants, in the presence of a basic catalyst such as triethylamine at room temperature in accordance with a conventional method.

The esterification ratio of such a quinonediazide sulfonate of the hydroxybenzophenone (C) [i.e. (number of quinonediazide sulfonyl groups per molecule of the quinonediazide sulfonate)×100/(number of hydroxyl groups per molecule of the hydroxybenzophenone)] is preferably from 50 to 90%. If the esterification ratio is too high, the masking effect tends to be so high that the sensitivity tends to deteriorate. On the other hand, if the esterification ratio is too low, the masking effect tends to be inadequate, whereby the pattern profile tends to be poor.

In the present invention, the above described compound having a quinonediazide photosensitive component bonded to the novolak resin (A) or (B) synthesized from specific starting materials, and the compound having a quinonediazide photosensitive component bonded to the specific hydroxybenzophenone (C), are used in combination as photosensitive compounds. Their mixing ratio is preferably such that $Q_1:Q_2$ is from 1:15 to 15:1, more preferably from 1:10 to 10:1, most preferably from 1:5 to 7:1, where $Q_1$ is the Q proportion of the former compound in the photoresist solution, and $Q_2$ is the Q proportion of the latter compound in the photoresist solution. Here, the Q proportion represents mmols of the quinonediazide sulfonic acid group per g of the total solid content in the photoresist solution. This mixing ratio influences the properties as the photoresist in such a manner that as the proportion of $Q_1$ increases the resolution tends to be improved, while as the proportion of $Q_2$ increases, the sensitivity tends to be improved. Therefore, depending upon the desired performance of the photoresist, the respective photosensitive compounds may be suitably mixed for use so that the ratio of the Q proportions will be within the above range.

As the solvent to be used in the present invention, any solvent may be employed so long as it is capable of dissolving the above described quinonediazide photosensitive compound and the alkali-soluble resin. From the viewpoint of handling efficiency for practical use, a solvent having a boiling point of from 60° to 220° C., particularly from 120° to 180° C., is preferred. Such a solvent may, for example, be an ether ester such as ethyl cellosolve acetate, methylcellosolve acetate, propylene glycol monomethyl ether acetate or propylene glycol monoethyl ether acetate, an ether alcohol such as ethyl cellosolve, methyl cellosolve or propylene glycol monomethyl ether, a carboxylate such as ethyl acetate, butyl acetate or ethyl butyrate, a lactone such as γ-butyrolactone, a ketone such as methyl ethyl ketone, methyl isobutyl ketone, methyl amyl ketone or ethyl butyl ketone, a cyclic ketone such as cyclopentane or cyclohexanone, a carboxylate of a dibasic acid such as diethyl oxalate or diethyl malonate, a dicarboxylate of a glycol such as ethylene glycol diacetate or propylene glycol diacetate, an oxycarboxylate such as methyl 2-hydroxypropionate, ethyl 2-hydroxypropionate, methyl 2-oxypropionate, ethyl 2-oxypropionate, methyl 3-methoxypropionate, methyl 3-ethoxypropionate or ethyl 3-ethoxypropioate, or a ketone ester such as ethylpyruvate. Among them, propylene glycol monomethyl ether acetate, propylene glycol monoethyl ether acetate, methyl 2-hydroxypropionate, ethyl 2-hydroxypropionate, methyl 3-methoxypropionate, methyl 3-ethoxypropionate, ethyl 3-ethoxypropionate, methyl amyl ketone or ethylbutyl ketone is preferred, since it is a solvent free from a problem from the viewpoint of safety, has a proper viscosity and presents a uniformity in coating, and the photoresist containing such solvent is excellent in the storage stability. Such solvents may be used alone, or in combination as a mixture of two or more of them.

The concentration of the alkali-soluble resin in the photoresist composition of the present invention is usually from 1 to 40 wt %. The concentration of the quinonediazide photosensitive compound is usually from 0.2 to 35 wt %, preferably from 0.2 to 32 wt %. Further, the Q proportion in the photoresist composition is usually from 0.4 to 0.9.

Further, to the photoresist composition of the present invention, a surfactant such as a polyoxyethylene ether or a fluorinated alkyl ester, may be incorporated to prevent a coating defect such as striation, as the case requires. The amount of such a surfactant is usually not more than 2 wt %, preferably not more than 1 wt % of the weight of the photoresist composition. Further, a dye or the like may be added to minimize the influence of irregularly reflected lights from the substrate at the time of copying an image, and a sensitizer or the like may be added to improve the sensitivity.

The photoresist composition of the present invention can readily be prepared by adding and mixing the alkali-soluble resin, the quinonediazide compounds and, if necessary a surfactant, etc. to the above solvent.

As will be be described hereinafter, the photoresist composition of the present invention can be applied to exposure with a light having a wavelength of from 330 to 450 nm. When the quinonediazide sulfonate of the novolak resin (A) of the above formula (i) is used as the photosensitive compound, the photoresist composition is particularly useful for exposure with i-line (wavelength: 365 nm). Likewise, when the quinonediazide sulfonate of the novolak resin (B) of the above formula (ii) is used as the photosensitive compound, it is particularly useful for exposure with i-line and g-line (wavelength: 436 nm).

The photosensitive resin composition of the present invention is useful for various conventional applications as a photosensitive resin composition. It is particularly useful as a photoresist for forming integrated circuits.

To form a resist pattern, the photoresist composition of the present invention is used in accordance with a conventional method through such steps as coating on a substrate, exposure to copy a pattern and development. The substrate on which the photoresist composition is coated, is a semiconductor substrate such as a silicon wafer. Coating of the photoresist composition on such a substrate is conducted usually by means of a spin coater, and the film thickness of the photoresist composition is usually from 0.3 to 5 µm. Usually, after coating the photoresist composition, the substrate is heated on e.g. a hot plate to remove the solvent, and then exposure is conducted through a mask to form a desired pattern on the substrate. For the exposure, a light with a wavelength of from 330 to 450 nm such as g-line (436 nm) or i-line (365 nm), is preferably employed. After the exposure, the substrate is heated at a temperature of from 90° to 120° C. for from 60 to 120 seconds, as the case requires, and then subjected to development with an aqueous alkaline solution. As the aqueous alkaline solution, an aqueous alkaline solution such as an aqueous solution of e.g. an inorganic alkali such as potassium hydroxide, sodium carbonate, sodium silicate, sodium methasilicate or aqueous ammonia, a primary amine such as ethylamine or n-propylamine, a secondary amine such as diethylamine or di-n-propylamine, or a tertiary amine such as triethylamine or trimethylamine, or a quaternary ammonium salt such as tetramethylammonium hydroxide or trimethylhydroxyethylammonium hydroxide, may preferably be employed. Further, an alcohol, a surfactant or the like may be incorporated to the developer, as the case requires.

The photosensitive resin composition of the present invention exhibits a practical sensitivity and a high resolving power especially when exposed to irradiation of ultraviolet rays with a wavelength within a range of from 330 to 450 nm, and the resist pattern formed with the composition of the present invention has an excellent pattern profile and high heat resistance and thus is useful particularly as a photoresist for forming highly integrated circuits.

Now, the present invention will be described in further detail with reference to Examples. However, it should be understood that the present invention is by no means restricted by such specific Examples. In the following Examples, the molecular weight of each novolak resin obtained in each of Novolak Resin Preparation Examples 1 to 9, is a weight average molecular weight as calculated as polystyrene from the results of the analysis by gel permeation chromatography, and the esterification ratio of each photosensitive material obtained in each of Photosensitive Material Preparation Examples 1 to 12 is an esterification ratio obtained from the molar ratio of the charged starting materials.

NOVOLAK RESIN PREPARATION EXAMPLE 1

Into a separable flask, 135.0 g of m-cresol, 180.0 g of p-cresol, 152.7 g of 2,5-xylenol and 15.0 g of oxalic acid dihydrate were charged. While stirring, heating and refluxing, the internal temperature was raised to 95° C., and 273.1 g of a 37% formalin aqueous solution was dropwise added thereto. The mixture was reacted for 5 hours while maintaining the temperature. Then, the internal temperature was raised to 180° C. over a period of 1.5 hours while distilling water off. After distilling water off, the internal temperature was further raised to 195° C., and unreacted monomers were distilled off under a reduced pressure of 15 Torr to obtain a novolak resin (a). The molecular weight of the novolak resin (a) was 5,400.

NOVOLAK RESIN PREPARATION EXAMPLE 2

Into a separable flask, 237.9 g of m-cresol, 190.3 g of p-cresol, 53.8 g of 2,5-xylenol, 15.0 g of oxalic acid dihydrate and 1 ml of 35% hydrochloric acid were charged, and 31.7 g of 90% acetaldehyde was dropwise added thereto under stirring at room temperature. Then, stirring was continued at room temperature for 30 minutes. Then, the internal temperature was raised to 95° C., and 210.1 g of a 37% formalin aqueous solution was dropwise added thereto. The mixture was reacted for 5 hours while maintaining the temperature. Then, the internal temperature was raised to 180° C. over a period of 1.5 hours while distilling water off. After distilling water off, the internal temperature was further raised to 195° C., and unreacted monomers were distilled off under a reduced pressure of 10 Torr to obtain a novolak resin (b). The molecular weight of the novolak resin (b) was 4,065. The ratio of formaldehyde/acetaldehyde (charged molar ratio) was 8/2.

NOVOLAK RESIN PREPARATION EXAMPLE 3

Into an eggplant-type flask, 324 g of m-cresol, 30 g of oxalic acid dihydrate, 3 ml of 35% hydrochloric acid and 300 ml of ethanol were charged, and 117.5 g of 90% acetaldehyde was dropwise added with stirring at room temperature. Then, the mixture was reacted for 5 hours under heating and refluXing while maintaining the oil bath temperature at 100° C. After completion of the reaction, the reaction solution was diluted with 300 ml of ethanol and then dropwise added into 3 l of water to precipitate crystals. The obtained precipitate was collected by filtration, washed three times with 3 l of water and dried to obtain a novolak resin (c). The molecular weight of the novolak resin (c) was 1.058.

NOVOLAK RESIN PREPARATION EXAMPLE 4

A novolak resin (d) was prepared in the same manner as in Novolak Resin Preparation Example 1 except that 475.4 g of m-cresol, 214.1 g of a 37% formalin aqueous solution and 15.0 g of oxalic acid dihydrate were added to the separable flask. The molecular weight of the novolak resin (d) was 750.

NOVOLAK RESIN PREPARATION EXAMPLE 5

Into a separable flask, 140.4 g of acetone was charged, 50.2 g of pyrogallol was added thereto. The mixture was stirred and dissolved at room temperature. Further, 0.23 g of phosphorus oxychloride was added thereto, and the mixture was heated, stirred and reacted for 5 hour while refluxing. After completion of the reaction, the reaction solution was cooled to 10° C. and poured into 3.6 l of water to precipitate crystals. The obtained precipitate was collected by filtration, washed with water and dried to obtain a novolak resin (e). The molecular weight of the novolak resin (e) was 1,250.

NOVOLAK RESIN PREPARATION EXAMPLE 6

A novolak resin (f) was prepared in the same manner as in Novolak Resin Preparation Example 1 except that 96.0 g of m-cresol, 120.0 g of p-cresol, 27.1 g of 2,5-xylenol and 7.6 g of oxalic acid dihydrate were charged into the separable flask, the internal temperature was raised to 95° C. while stirring, heating and refluxing, and 123.6 g of a 37% formalin aqueous solution was dropwise added thereto. The molecular weight of the novolak resin (f) was 6,500.

NOVOLAK RESIN PREPARATION EXAMPLE 7

A novolak resin (g) was prepared in the same manner as in Novolak Resin Preparation Example 3 except that 108.0 g of m-cresol, 10.0 g of oxalic acid dihydrate, 1 ml of 35% hydrochloric acid and 300 ml of ethanol were charged to the eggplant-type flask and 48.9 g of 90% acetaldehyde was dropwise added thereto with stirring at room temperature. The molecular weight of the novolak resin (g) was 1,834.

NOVOLAK RESIN PREPARATION EXAMPLE 8

A novolak resin (h) was prepared in the same manner as in Novolak Resin Preparation Example 3 except that 86.5 g of m-cresol, 22.0 g of resorcinol, 10.0 g of oxalic acid dihydrate, 0.5 ml of 35% hydrochloric acid and 100 ml of ethanol were charged to the eggplant-type flask, and 29.5 g of 100% acetaldehyde was dropwise added thereto with stirring at room temperature. The molecular weight of the novolak resin (h) was 905.

NOVOLAK RESIN PREPARATION EXAMPLE 9

A novolak resin (j) was prepared in the same manner as in Novolak Resin Preparation Example 2 except that 475.2 g of m-cresol, 23.8 g of 90% acetaldehyde and 150.8 g of a 37% formalin aqueous solution were used. The molecular weight of the novolak resin (j) was 620.

PHOTOSENSITIVE MATERIAL PREPARATION EXAMPLE 1

31.7 g of the novolak resin (c) and 26.0 g of 1,2-naphthoquinonediazide-5-sulfonyl chloride were dissolved in a solvent mixture comprising 160 ml of acetone and 44 ml of N-methylpyrrolidone, and 10.6 g of triethylamine was dropwise added thereto. The mixture was reacted at room temperature for two hours. Then, the reaction solution was filtrated to remove triethylamine hydrochloride. The filtrate was added to 1 l of water, and precipitated crystals were collected by filtration, washed with water and dried to obtain a photosensitive material (P-1). The esterification ratio of the photosensitive material (P-1) was 40%.

PHOTOSENSITIVE MATERIAL PREPARATION EXAMPLE 2

A photosensitive material (P-2) was prepared in the same manner as in Photosensitive Material Preparation Example 1 except that 32.3 g of the novolak resin (d) and 40.2 g of 1,2-naphthoquinonediazide-5-sulfonyl chloride were dissolved in a solvent mixture comprising 200 ml of acetone and 50 ml of N-methylpyrrolidone, and 16.4 g of triethylamine was dropwise added thereto. The esterification ratio of the photosensitive material (P-2) was 55%.

PHOTOSENSITIVE MATERIAL PREPARATION EXAMPLE 3

A photosensitive material (P-3) was prepared in the same manner as in Photosensitive Material Preparation Example 1 except that 12.1 g of 2,3,4,2',4'-pentahydroxybenzophenone and 52.1 g of 1,2-naphthoquinonediazide-5-sulfonyl chloride were dissolved in a solvent mixture comprising 200 ml of dioxane and 50 ml of N-methylpyrrolidone, and 23.2 g of triethylamine was dropwise added thereto. The esterification ratio of the photosensitive material (P-3) was 84%.

PHOTOSENSITIVE MATERIAL PREPARATION EXAMPLE 4

A photosensitive material (P-4) was prepared in the same manner as in Photosensitive Material Preparation Example 1 except that 7.5 g of the novolak resin (e) and 18.7 g of 1,2-naphthoquinonediazide-5-sulfonyl chloride were dissolved in a solvent mixture comprising 100 ml of acetone and 25 ml of N-methylpyrrolidone, and 8.3 g of triethylamine was dropwise added thereto. The esterification ratio of the photosensitive material (P-4) was 50%.

PHOTOSENSITIVE MATERIAL PREPARATION EXAMPLE 5

A photosensitive material (P-5) was prepared in the same manner as in Photosensitive Material Preparation Example 1 except that 12.1 g of 2,3,4,2',4'-pentahydroxybenzophenone and 46.5 g of 1,2-naphthoquinonediazide-5-sulfonyl chloride were dissolved in a solvent mixture comprising 200 ml of 1,4-dioxane and 50 ml of N-methylpyrrolidone, and 18.9 g of triethylamine was dropwise added thereto. The esterification ratio of the photosensitive material (P-5) was 75%.

PHOTOSENSITIVE MATERIAL PREPARATION EXAMPLE 6

A photosensitive material (P-6) was prepared in the same manner as in Photosensitive Material Preparation Example 1 except that 14.0 g of 2,3,4-trihydroxybenzophenone and 36.8 g of 1,2-naphthoquinonediazide-5-sulfonyl chloride were dissolved in a solvent mixture comprising 107.4 g of 1,4-dioxane and 29.1 g of N-methylpyrrolidone, and 15.0 g of triethylamine was dropwise added thereto. The esterification ratio of the photosensitive material (P-6) was 75%.

PHOTOSENSITIVE MATERIAL PREPARATION EXAMPLE 7

A photosensitive material (P-7) was prepared in the same manner as in Photosensitive Material Preparation Example 1 except that 45.9 g of the novolak resin (g) and 46.3 g of 1,2-naphthoquinonediazide-5-sulfonyl chloride were dissolved in a solvent mixture comprising 240 g of acetone and 65 g of N-methylpyrrolidone, and 18.4 g of triethylamine was dropwise added thereto. The esterification ratio of the photosensitive material (P-7) was 50%.

PHOTOSENSITIVE MATERIAL PREPARATION EXAMPLE 8

A photosensitive material (P-8) was prepared in the same manner as in Photosensitive Material Preparation Example 1 except that 114.8 g of the novolak resin (h) and 135.0 g of 1,2-naphthoquinonediazide-5-sulfonyl chloride were dissolved in a solvent mixture comprising 553 g of acetone and 187 g of N-methylpyrrolidone, and 54.9 g of triethylamine was dropwise added thereto. The esterification ratio of the photosensitive material (P-8) was 50%.

PHOTOSENSITIVE MATERIAL PREPARATION EXAMPLE 9

A photosensitive material (P-9) was prepared in the same manner as in Photosensitive Material Preparation Example 1 except that 16.6 g of 2,3,4,4'-tetrahydroxybenzophenone and 54.4 g of 1,2-naphthoquinonediazide-5-sulfonyl chloride were dissolved in a solvent mixture comprising 161.5 g of 1,4-dioxane and 48.5 g of N-methylpyrrolidone, and 20.5 g of triethylamine was dropwise added thereto. The esterification ratio of the photosensitive material (P-9) was 75%.

PHOTOSENSITIVE MATERIAL PREPARATION EXAMPLE 10

A photosensitive material (P-10) was prepared in the same manner as in Photosensitive Material Preparation Example 1 except that 7.32 g of Gallein and 21.6 g of 1,2-naphthoquinonediazide-5-sulfonyl chloride were dissolved in a solvent mixture comprising 160.0 g of 1,4-dioxane and 24.0 g of N-methylpyrrolidone, and 8.1 g of triethylamine was dropwise added thereto. The esterification ratio of the photosensitive material (P-10) was 100%.

PHOTOSENSITIVE MATERIAL PREPARATION EXAMPLE 11

A photosensitive material (P-11) was prepared in the same manner as in Photosensitive Material Preparation Example 1 except that 24.9 g of the novolak resin (j) and 32.9 g of 1,2-naphthoquinonediazide-5-sulfonyl chloride were dissolved in a solvent mixture comprising 152 ml of acetone and 40 ml of N-methylpyrrolidone, and 12.9 g of triethylamine was dropwise added thereto. The esterification ratio of the photosensitive material (P-11) was 47%.

PHOTOSENSITIVE MATERIAL PREPARATION EXAMPLE 12

A photosensitive material (P-12) was prepared in the same manner as in Photosensitive Material Preparation Example 1 except that 22.9 g of 2,3,4,2',4'-pentahydroxybenzophenone and 70.5 g of 1,2-naphthoquinonediazide-5-sulfonyl chloride were dissolved in a solvent mixture comprising 240 ml of 1,4-dioxane and 65 ml of N-methylpyrrolidone, and 27.1 g of triethylamine was dropwise added thereto. The esterification ratio of the photosensitive material (P-12) was 60%.

The photosensitive materials prepared in the foregoing Photosensitive Material Preparation Examples are summarized in Tables 1 and 2.

TABLE 1

| Photosensitive material No. | Novolak resin constituting the photosensitive material | | | | Esterification ratio (%) | Note |
|---|---|---|---|---|---|---|
| | No. | Phenols or polyhydroxybenzenes | Carbonyl compounds | Mw | | |
| P-1 | (c) | m-cresol | Acetaldehyde | 1,058 | 40 | |
| P-2 | (d) | m-cresol | Formaldehyde | 750 | 55 | Comparative Photosensitive material |
| P-4 | (e) | Pyrogallol | Acetone | 1,250 | 50 | |
| P-7 | (g) | m-cresol | Acetaldehyde | 1,834 | 50 | |
| P-8 | (h) | m-cresol Resorcinol | Acetaldehyde | 905 | 50 | |
| P-11 | (j) | m-cresol | Acetaldehyde Formaldehyde | 620 | 47 | |

TABLE 2

| Photosensitive material No. | Hydroxy compound constituting the photosensitive material | Esterification ratio (%) | Note |
|---|---|---|---|
| P-3 | 2,3,4,2',4'-pentahydroxybenzophenone | 84 | |
| P-5 | 2,3,4,2',4'-pentahydroxybenzophenone | 75 | |
| P-6 | 2,3,4-trihydroxybenzophenone | 75 | |
| P-9 | 2,3,4,4'-tetrahydroxybenzophenone | 75 | |
| P-10 | Gallein | 47 | Comparative photosensitive material |
| P-12 | 2,3,4,2',4'-pentahydroxybenzophenone | 60 | |

PHOTORESIST COMPOSITION PREPARATION EXAMPLE 1

6.046 g of the novolak resin (b) as the alkali-soluble resin, and 2.883 g of the photosensitive material (P-1) and 0.271 g of the photosensitive material (P-3) 5 were dissolved in 30.8 g of methyl 3-methoxypropionate, and in order to improve the coating properties, a fluorine-type surfactant ("Florard FC-430", tradename, manufactured by Sumitomo 3M K.K.) was further added thereto in an amount of 100 p.p.m. The solution was filtered through a membrane filter having a pore size of 0.2 µm to obtain a photoresist composition (PR-1).

PHOTORESIST COMPOSITION PREPARATION EXAMPLES 2 TO 22

Photoresist compositions (PR-2) to (PR-22) were prepared in the same manner as in Photoresist Composition Preparation Example 1 except that the alkali-soluble resins and the photosensitive compounds as identified in Table 3 were combined in the proportions as identified in Table 3.

EXAMPLES 1 TO 10 AND COMPARATIVE EXAMPLES 1 TO 12

Photoresist compositions (PR-1) to (PR-22) were subjected to patterning in accordance with Patterning Methods 1 to 5 as described hereinafter, and the sensitivity, the resolution, the exposure margin and the heat resistance were evaluated. The results are shown in Tables 4 to 8. The following symbols and terms used in Tables 4 to 8 have the following meanings respectively.

Eth: The minimum exposure quantity required to dissolve an exposed portion of 1.4×1.4 mm of the photoresist film completely to the substrate by an alkali developer, was represented by the exposure time.

$E_0$: The exposure quantity whereby when the line and space patterns on a mask of 0.5 µm (in the case of exposure with i-line) or 0.8 µm (in the case of exposure with g-line) in width, were 1:1, after the exposure and development with an alkali developer, the line widths of the exposed portion and the non-exposed portion were obtained at 1:1 of 0.5 µm (in the case of exposure with i-line) or 0.8 µm (in the case of exposure with g-line) in width without reduction of a photoresist film, was represented by the exposure time.

Resolution: The minimum width of the line and space patterns capable of being resolved with an exposure of $E_0$.

Heat resistance: The maximum temperature at which the 5 µm line and space patterns undergo no deformation when the wafer is heated on a hot plate for 5 minutes.

Patterning Method 1

A photoresist composition (PR-1 to PR-8) was coated on a silicon wafer by a spin coater and heated on a hot plate of 90° C. for 60 seconds to remove the solvent and to form a photoresist film having a thickness of 1.07 µm. This coated wafer was subjected to exposure by an i-line stepper (NA=0.50) manufactured by Nikon and then heated on a hot plate of 110° C. for 60 seconds. Then, it was developed by immersing it in a 2.38% tetramethylammonium hydroxide aqueous solution at 23° C. for 60 seconds.

Patterning Method 2

A photoresist composition (PR-9 to PR-12) was coated on a silicon wafer by a spin coater and heated on a hot plate of 80° C. for 90 seconds to remove the solvent and to form a photoresist film having a thickness of 1.03 µm. This coated wafer was subjected to exposure by a g-line stepper (NA=0.38) manufactured by GSJ and then heated on a hot plate of 120° C. for 90 seconds. Then, it was developed by immersing it in a 2.38% tetramethylammonium hydroxide aqueous solution at 23° C. for 60 seconds.

Patterning Method 3

A photoresist composition (PR-13 to PR-14 and PR-19 to PR-22) was coated on a silicon wafer by a spin coater and heated on a hot plate of 95° C. for 60 seconds to remove the solvent and to form a photoresist film having a thickness of 1.03 µm. This coated wafer was subjected to exposure by a g-line stepper (NA=0.38) manufactured by GSJ. Then, it was developed by immersing it in a 2.38% tetramethylammonium hydroxide aqueous solution at 23° C. for 60 seconds.

Patterning Method 4

Patterning was conducted in the same manner as in Patterning Method 1 except that a photoresist composition (PR-15 to PR-16) was coated on a silicon wafer by a spin coater and heated on a hot plate of 90° C. for 60 seconds to remove the solvent and to form a photoresist film having a thickness of 1.02 µm.

Patterning Method 5

Patterning was conducted in the same manner as in Patterning Method 1 except that a photoresist composition (PR-17 to PR-18) was coated on a silicon wafer by a spin coater and heated on a hot plate of 90° C. for 60 seconds to remove the solvent and to form a photoresist film having a thickness of 1.22 µm.

TABLE 3

| | Photoresist composition | Alkali-soluble resin | Photosensitive materials First component No. | Esterification ratio (%) | Second component No. | Esterification ratio (%) | Q proportions in the change (First component/second component) | Q proportion | Patterning method |
|---|---|---|---|---|---|---|---|---|---|
| Example 1 | PR-1 | b | P-1 | 40 | P-3 | 84 | 5.60 | 0.66 | 1 |
| Example 2 | PR-2 | b | P-1 | 40 | P-3 | 84 | 4.50 | 0.66 | 1 |
| Example 3 | PR-3 | b | P-1 | 40 | P-3 | 84 | 3.13 | 0.66 | 1 |
| Example 4 | PR-4 | b | P-1 | 40 | P-3 | 84 | 2.00 | 0.66 | 1 |
| Comparative Example 1 | PR-5 | b | P-2 | 55 | P-3 | 84 | 5.60 | 0.66 | 1 |
| Comparative Example 2 | PR-6 | b | P-2 | 55 | P-3 | 84 | 4.50 | 0.66 | 1 |
| Comparative Example 3 | PR-7 | b | P-2 | 55 | P-3 | 84 | 3.13 | 0.66 | 1 |
| Comparative Example 4 | PR-8 | b | P-2 | 55 | P-3 | 84 | 2.00 | 0.66 | 1 |
| Example 5 | PR-9 | a | P-4 | 50 | P-3 | 84 | 4.00 | 0.75 | 2 |
| Example 6 | PR-10 | a | P-4 | 50 | P-3 | 84 | 1.14 | 0.75 | 2 |
| Comparative Example 5 | PR-11 | a | P-2 | 55 | P-3 | 84 | 4.00 | 0.75 | 2 |
| Comparative Example 6 | PR-12 | a | P-2 | 55 | P-3 | 84 | 1.14 | 0.75 | 2 |
| Example 7 | PR-13 | a | P-4 | 50 | P-5 | 75 | 0.88 | 0.75 | 3 |
| Comparative Example 7 | PR-14 | a | P-6 | 75 | P-5 | 75 | 0.88 | 0.75 | 3 |
| Example 8 | PR-15 | b | P-1 | 40 | P-3 | 84 | 2.50 | 0.70 | 4 |
| Comparative Example 8 | PR-16 | b | P-8 | 50 | P-2 | 55 | 2.50 | 0.70 | 4 |
| Example 9 | PR-17 | f | P-7 | 50 | P-9 | 75 | 4.00 | 0.50 | 4 |
| Comparative Example 9 | PR-18 | f | P-7 | 50 | P-10 | 100 | 4.00 | 0.50 | 4 |
| Example 10 | PR-19 | a | P-11 | 47 | P-12 | 60 | 0.35 | 0.85 | 3 |
| Comparative Example 10 | PR-20 | a | P-11 | 47 | — | — | ∞ | 0.85 | 3 |
| Comparative Example 11 | PR-21 | a | — | — | P-12 | 60 | 0.00 | 0.85 | 5 |
| Comparative Example 12 | PR-22 | a | P-11 | 47 | P-1 | 40 | 0.35 | 0.85 | 5 |

TABLE 4

(i-line)

| | Photoresist composition | Eth (msec) | Eo (msec) | Resolution (μm) | Heat resistance (°C.) |
|---|---|---|---|---|---|
| Example 1 | PR-1 | 302 | 591 | 0.36 | 130 |
| Example 2 | PR-2 | 288 | 563 | 0.36 | 130 |
| Example 3 | PR-3 | 270 | 507 | 0.36 | 130 |
| Example 4 | PR-4 | 240 | 446 | 0.36 | 130 |
| Comparative Example 1 | PR-5 | 249 | 507 | 0.38 | 115 |
| Comparative Example 2 | PR-6 | 246 | 500 | 0.38 | 115 |
| Comparative Example 3 | PR-7 | 232 | 483 | 0.40 | 120 |
| Comparative Example 4 | PR-8 | 209 | 456 | 0.40 | 120 |

TABLE 5

(g-line)

| | Photoresist composition | Eth (msec) | Eo (msec) | Resolution (μm) | Heat resistance (°C.) |
|---|---|---|---|---|---|
| Example 5 | PR-9 | 132 | 260 | 0.60 | 140 |
| Example 6 | PR-10 | 106 | 230 | 0.60 | 140 |
| Comparative Example 5 | PR-11 | 218 | 475 | 0.60 | 120 |
| Comparative Example 6 | PR-12 | 160 | 337 | 0.60 | 120 |

The results in Table 4 show that Examples 1 to 4 wherein quinonediazide sulfonates of novolak resins (A) as defined by the present invention were used, present remarkably improved resolution and heat resistance as compared with Comparative Examples 1 to 4 wherein quinonediazide sulfonates of novolak resins outside the definition by the present invention were used, even when a quinonediazide sulfonate of a novolak resin and a quinonediazide sulfonate of a polyhydroxybenzophenone were used in combination in both cases.

The results in Table 5 show that Examples 5 and 6 wherein quinonediazide sulfonates of novolak resins (B) as defined by the present invention were used, present remarkably improved sensitivity and heat resistance, as compared with Comparative Examples 5 and 6 wherein quinonediazide sulfonates of novolak resins outside the definition by the present invention were used, even when a quinonediazide sulfonate of a novolak resin and a quinonediazide sulfonate of a polyhydroxybenzophenone are used in combination in both cases.

TABLE 6

(g-line)

| Photoresist composition | Eth (msec) | Eo (msec) | Resolution (μm) | Heat resistance (°C.) |
|---|---|---|---|---|
| Example 7 | PR-13 | 78 | 130 | 0.70 | 135 |
| Comparative Example 7 | PR-14 | 94 | 178 | 0.90 | 130 |

The results of Table 6 show that Example 7 of the preset invention presents remarkably improved sensitivity and resolution as compared with Comparative Example 7 wherein two types of quinonediazide sulfonates of polyhydroxybenzophenones were used in combination.

TABLE 7

(i-line)

| Photoresist composition | Eth (msec) | Eo (msec) | Resolution (μm) | Heat resistance (°C.) |
|---|---|---|---|---|
| Example 8 | PR-15 | 234 | 443 | 0.36 | 130 |
| Comparative Example 8 | PR-16 | 222 | 434 | 0.40 | 125 |

The results in Table 7 show that Example 8 of the present invention presents a remarkably improved resolution as compared with Comparative Example 8 wherein two types of quinonediazide sulfonates of novolak resins were used in combination.

TABLE 8

(i-line)

| Photoresist composition | Eth (msec) | Eo (msec) | Resolution (μm) | Heat resistance (°C.) |
|---|---|---|---|---|
| Example 9 | PR-17 | 300 | 522 | 0.36 | 125 |
| Comparative Example 9 | PR-18 | 320 | 550 | 0.40 | 115 |

The results in Table 8 show that Example 9 of the present invention presents remarkably improved sensitivity, resolution and heat resistance as compared with Comparative Example 9 wherein the photosensitive material to be used in combination with the quinonediazide sulfonate of a novolak resin was outside the definition of the present invention.

TABLE 9

(g-line)

| Photoresist composition | Eth (msec) | Eo (msec) | Resolution (μm) | Heat resistance (°C.) |
|---|---|---|---|---|
| Example 10 | PR-19 | 82 | 135 | 0.65 | 130 |
| Comparative Example 10 | PR-20 | 230 | 440 | 0.70 | 120 |
| Comparative Example 11 | PR-21 | 15 | 25 | 0.80 | 135 |
| Comparative Example 12 | PR-22 | 270 | 510 | 0.70 | 125 |

The results in Table 9 show that Example 10 of the present invention presents remarkably improved sensitivity, resolution and heat resistance as compared with Comparative Example 10 wherein the quinonediazide sulfonate of a novolak resin (A) as defined by the present invention was used alone, or as compared with Comparative Example 12 wherein two types of quinonediazide sulfonates of novolak resins (A) were used in combination. Comparative Example 11 wherein the quinonediazide sulfonate of a hydroxybenzophenone (C) as defined by the present invention, was used alone, presents good sensitivity and heat resistance, but shows a very poor resolution. Whereas, Example 10 of the present invention has a practical sensitivity and heat resistance and presents a remarkably improved resolution.

What is claimed is:

1. A photosensitive resin composition, comprising an alkali-soluble resin, a quinonediazide photosensitive compound and a solvent, wherein the photosensitive compound comprises a quinonediazide sulfonate of a novolak resin of the formula (i) having a weight average molecular weight of from 600 to 2,200, and a quinonediazide sulfonate of a hydroxybenzophenone having the formula (iii):

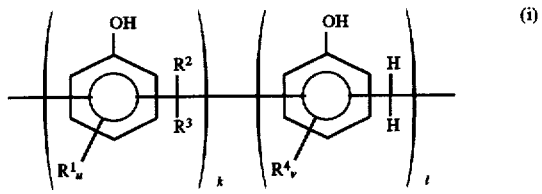

wherein each of $R^1$ and $R^4$ is an alkyl group, $R^2$ is an alkyl group or an aryl group, $R^3$ is a hydrogen atom or an alkyl group, each of u and v is an integer of from 0 to 3, provided that when each of $R^1$ and $R^4$ is present in a plurality, the plurality of each of $R^1$ to $R^4$ may be the same or different, and each of k and l is a number of at least 0, provided that k:l=1:9 to 10:0;

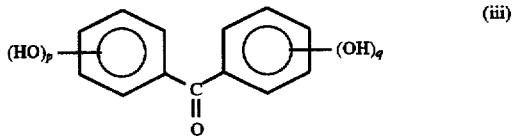

wherein each of p and q is an integer of at least 0, provided that $3 \leq p+l \leq 6$, and
wherein the esterification ratio of the quinonediazide sulfonate of the novolak resin (i) is from 20 to 80%, and the esterification ratio of the guinonediazide sulfonate of the hydroxybenzophenone (iii) is from 50 to 90%.

2. The composition according to claim 1, wherein the alkali-soluble resin is a novolak resin having a weight average molecular weight of from 3,000 to 20,000.

3. The composition according to claim 1, wherein the alkali-soluble resin is a condensation product of a carbonyl compound with m-cresol:p-cresol:2,5- or 3,5-xylenol:resorcinol= 1-7:3-7:0-5:0-1 (molar ratio).

4. The composition according to claim 3, wherein the carbonyl compound is formaldehyde alone or a mixture of formaldehyde:acetaldehyde=95-40:5-60 (molar ratio).

5. The composition according to claim 1, wherein the alkali-soluble resin is a condensation product of a mixture of m-cresol, p-cresol and 2,5-xylenol with the mixing ratio of m-cresol:p-cresol:2,5-xylonol=3-6:3-5:0-3 (molar ratio) with formaldehyde alone or a mixture of formaldehyde and acetaldehyde with the mixing ratio of formaldehyde:acetaldehyde=90-50:10-50 (molar ratio).

6. The composition according to claim 1, wherein in the formula (i), $R^1$ and $R^4$ are the same, each being a $C_{1-2}$ alkyl group, $R^2$ is a methyl group, $R^3$ is a hydrogen atom or a methyl group, and each of u and v is 1.

7. The composition according to claim 1, wherein in the formula (i), each of $R^1$, $R^2$ and $R^4$ is a methyl group, $R^3$ is a hydrogen atom or a methyl group, and each of u and v is 1.

8. The composition according to claim 1, wherein in the formula (i), l is 0.

9. The composition according to claim 1, wherein in the formula (iii), $5 \leq p+q \leq 6$.

10. The composition according to claim 1, wherein in the formula (iii), p+q=5.

11. The composition according to claim 1, wherein $Q_1:Q_2=1:15$ to $15:1$, where $Q_1$ is the Q proportion in the quinonediazide sulfonate of the novolak resin, and $Q_2$ is the Q proportion for the quinonediazide sulfonate of the hydroxybenzophenone (C).

12. The composition according to claim 1, wherein the quinonediazide sulfonate is a 1,2-naphthoquinonediazide-5-sulfonate.

13. The composition according to claim 1, wherein the quinonediazide sulfonate is a 1,2-naphthoquinonediazide 4-sulfonate.

14. The composition according to claim 1, wherein the alkali-soluble resin is in an amount of 1 to 40 wt %, and the photosensitive compound is in an amount of from 0.2 to 35 wt %.

15. The composition according to claim 11 wherein the (i) to (iii) proportion is from 0.4 to 0.9.

16. The composition according to claim 1, wherein k:l= 2:8 to 10:0.

17. A method for forming a resist pattern on a substrate for a semiconductor, which comprises coating on the substrate a photosensitive resin composition comprising an alkali-soluble resin composition comprising an alkali-soluble resin, a quinonediazide photosensitive compound and a solvent, wherein the photosensitive compound comprises a quinonediazide sulfonate of a novolak resin of the formula (i) having a weight average molecular weight of from 600 to 2,200, and a quinonediazide sulfonate of a hydroxybenzophenone of the formula (iii):

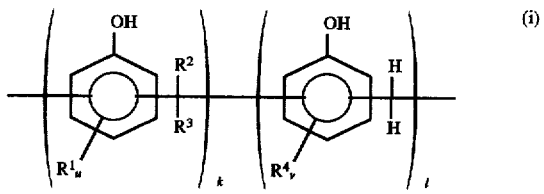

wherein each of $R^1$ and $R^4$ is an alkyl group, $R^2$ is an alkyl group or an aryl group, $R^3$ is a hydrogen atom or an alkyl group, each of u and v is an integer of from 0 to 3, provided that when each of $R^1$ to $R^4$ is present in a plurality, the plurality of $R^1$ or $R^4$ may be the same or different, and each of k and l is a number of at least 0, provided that k:l=1:9 to 10:0;

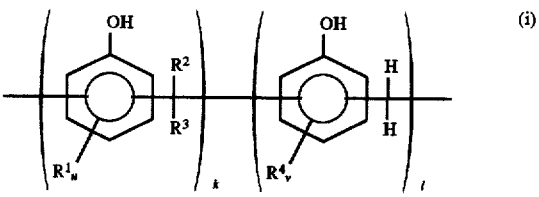

wherein each of p and q is an integer of at least 0, provided that $3 \leq p+1 \leq 6$, and wherein the esterification ratio of the guinonediazide sulfonate of the novolak resin (i) is from 20 to 80%, and the esterification ratio of the guinonediazide sulfonate of the hydroxybenzophenone (iii) is from 50 to 90% and subjecting it to exposure to copy a pattern and developing the same to form the pattern.

* * * * *